US012063752B2

(12) United States Patent
Wei et al.

(10) Patent No.: US 12,063,752 B2
(45) Date of Patent: Aug. 13, 2024

(54) METHODS OF MANUFACTURING CIRCUIT BOARD AND CIRCUIT BOARD ASSEMBLY

(71) Applicants: Avary Holding (Shenzhen) Co., Limited., Shenzhen (CN); QING DING PRECISION ELECTRONICS (HUAIAN) CO., LTD, Huai an (CN)

(72) Inventors: Wen-Zhu Wei, Shenzhen (CN); Ming-Jaan Ho, New Taipei (TW); Fu-Yun Shen, Shenzhen (CN); Hong-Yan Guo, Shenzhen (CN)

(73) Assignees: Avary Holding (Shenzhen) Co., Limited., Shenzhen (CN); QING DING PRECISION ELECTRONICS (HUAIAN) CO., LTD, Huai an (CN)

( * ) Notice: Subject to any disclaimer, the term of this patent is extended or adjusted under 35 U.S.C. 154(b) by 559 days.

(21) Appl. No.: 17/289,035

(22) PCT Filed: May 29, 2020

(86) PCT No.: PCT/CN2020/093452
§ 371 (c)(1),
(2) Date: Apr. 27, 2021

(87) PCT Pub. No.: WO2021/036379
PCT Pub. Date: Mar. 4, 2021

(65) Prior Publication Data
US 2021/0410295 A1 Dec. 30, 2021

(30) Foreign Application Priority Data

Aug. 31, 2019 (CN) .......................... 201910819986.8

(51) Int. Cl.
*H05K 3/46* (2006.01)
*H05K 1/02* (2006.01)
(Continued)

(52) U.S. Cl.
CPC ......... *H05K 3/4614* (2013.01); *H05K 1/0218* (2013.01); *H05K 1/0298* (2013.01);
(Continued)

(58) Field of Classification Search
CPC ...... H05K 3/4614; H05K 3/06; H05K 3/4061; H05K 2203/0723; H05K 1/0218;
(Continued)

(56) References Cited

U.S. PATENT DOCUMENTS

| 8,658,904 B2 * | 2/2014 | Naganuma | ........... H05K 3/4691 |
| | | | 174/262 |
| 9,445,511 B2 * | 9/2016 | Kanda | ................... H05K 3/4069 |
| 2002/0086145 A1 * | 7/2002 | Yazaki | ................. H05K 3/4617 |
| | | | 428/209 |

(Continued)

FOREIGN PATENT DOCUMENTS

| CN | 103167727 A | 6/2013 |
| CN | 104582240 A | 4/2015 |

(Continued)

*Primary Examiner* — Donghai D Nguyen
(74) *Attorney, Agent, or Firm* — ScienBiziP, P.C.

(57) ABSTRACT

A circuit board includes first circuit substrate and second circuit substrate; first circuit substrate includes: a first base layer arranged on the first circuit layer and a plurality of first conductive bodies on the substrate layer; the first circuit layer includes a hot pressing area and a non-hot pressing area except the hot pressing area. One end of the first conductive body is electrically connected to the hot pressing area and the other end is exposed to the first base layer; second circuit substrate includes: a second base layer, a second base layer arranged on the second circuit layer and a plurality of second conductive bodies; one end of the second conductive body is electrically connected to the second circuit layer, and the other end is exposed on the second base layer; The body is electrically connected to the second conductive body.

11 Claims, 12 Drawing Sheets

(51) Int. Cl.
 *H05K 3/06* (2006.01)
 *H05K 3/40* (2006.01)
(52) U.S. Cl.
 CPC ............. *H05K 3/06* (2013.01); *H05K 3/4061* (2013.01); *H05K 1/0237* (2013.01); *H05K 1/0277* (2013.01); *H05K 2203/0723* (2013.01); *H05K 2203/1121* (2013.01)
(58) Field of Classification Search
 CPC ........ H05K 1/0298; H05K 2201/09563; Y10T 29/49128; Y10T 29/49155; Y10T 29/49165
 See application file for complete search history.

(56) References Cited

U.S. PATENT DOCUMENTS

| | | | | |
|---|---|---|---|---|
| 2009/0176384 | A1* | 7/2009 | Fujiwara | H05K 3/361 |
| | | | | 174/260 |
| 2018/0070458 | A1 | 3/2018 | Ahn et al. | |

FOREIGN PATENT DOCUMENTS

| | | |
|---|---|---|
| CN | 106658967 A | 5/2017 |
| CN | 108093554 A | 5/2018 |
| CN | 109936919 A | 6/2019 |
| CN | 110072350 A | 7/2019 |
| JP | H09237854 A | 9/1997 |
| JP | 2005109188 | 4/2005 |

* cited by examiner

METHODS OF MANUFACTURING CIRCUIT BOARD AND CIRCUIT BOARD ASSEMBLY

FIELD

The disclosure relates to a circuit board, a manufacturing method thereof, and a manufacturing method of a circuit board assembly.

BACKGROUND

In terminal electronic equipment, high-frequency transmission lines need to be connected to a motherboard. The transmission lines manufactured by a thermocompression bonding process are usually welded to the main board by thermocompression soldering. However, during the soldering process, conductive paste in the transmission lines have poor thermal conductivity and can easily form sintered interfaces (IMC) with a copper layer, resulting in reduced reliability of a connection between the transmission lines and the main board.

SUMMARY OF THE DISCLOSURE

In view of this, it is necessary to provide a circuit board that can form a reliable connection with the motherboard by soldering.

In addition, it is necessary to provide a method for manufacturing a circuit board.

In addition, it is also necessary to provide a method for manufacturing a circuit board assembly.

A method for manufacturing a circuit board includes the steps:

Providing a first circuit substrate; the first circuit substrate includes a first base layer, a first circuit layer, and a plurality of first conductive bodies arranged in the first base layer; the first conductive bodies are formed by an electroplating process; wherein, the first circuit layer includes an etching line; the etching line divides the first circuit layer into a hot pressing area located inside the etching line and a non-hot pressing area located outside the etching line; the hot pressing area includes the plurality of first conductive bodies; the first conductive body includes a first end and a second end opposite the first end; the first end is electrically connected to the hot pressing area;

Providing a second circuit substrate; the second circuit substrate includes a second base layer, a second circuit layer, and a plurality of second conductive bodies; the second conductive bodies include a conductive paste; wherein: the second conductive body includes a third end and a fourth end opposite the third end; the third end is electrically connected to the second circuit layer; and Stacking the first circuit substrate and the second circuit substrate such that the second end corresponds to the fourth end in position to obtain an intermediate body; and pressing and bonding the intermediate body so that the second end and the fourth end are electrically connected to obtain the circuit board.

Further, providing the first circuit substrate includes the steps of:

Providing a double-sided copper-clad substrate; the double-sided copper-clad substrate includes a first base layer, a first copper foil layer, and a second copper foil layer; the first copper foil layer and the second copper foil layer are arranged on two opposite surfaces of the first base layer;

Defining a plurality of first via holes in the double-sided copper-clad substrate; the first via holes penetrate the second copper foil layer and the first base layer;

Electroplating the second copper foil layer to form an electroplated layer; a portion of the electroplated layer is filled in the first via holes to form the first conductive bodies; and Etching the first copper foil layer to obtain the first circuit layer, and etching the second copper foil layer and the electroplated layer to obtain a third circuit layer, thereby obtaining the first circuit substrate.

Further, the third circuit layer includes a signal circuit and a plurality of first ground pads electrically isolated from the signal circuit; a side of the first ground pads adjacent to the first circuit layer is electrically connected to the first circuit layer through the first conductive bodies, and a side of the first ground pads away from the first circuit layer is electrically connected to the second circuit layer through the second conductive bodies; the electrically connected first circuit layer, first conductive bodies, first ground pads, second conductive bodies, and second circuit layer form a shielding shell; and the signal circuit is located in the shielding shell.

Further, the plurality of first ground pads includes two electrically conductive first ground pads; and the two electrically conductive first ground pads are electrically connected to the hot pressing area and the non-hot pressing area, respectively, through two first conductive bodies, so that the hot pressing area and the non-hot pressing area are electrically connected to each other.

Further, the hot pressing area includes a copper sheet; the copper sheet is electrically connected to the non-hot pressing area; a second ground pad and a first signal pad are arranged in the copper sheet; the second ground pad and the first ground pads are electrically connected through the first conductive bodies; the second ground pad and the copper sheet are electrically connected through a plurality of microstructures; the first signal pad and the signal circuit are electrically connected through the first conductive bodies; and the first signal pad is electrically isolated from the copper sheet.

Further, providing the second circuit substrate includes the steps of:

Providing a single-sided copper-clad substrate; the single-sided copper-clad substrate includes a second base layer and a third copper foil layer formed on a surface of the second base layer;

Etching the third copper foil layer to form the second circuit layer;

Defining a plurality of second via holes in the second base layer; the second via holes penetrate the second base layer; and Filling the second via holes with a conductive paste to obtain the second conductive bodies, thereby obtaining the second circuit substrate.

Further, the second circuit layer includes at least one second signal pad and at least one third ground pad electrically isolated from the second signal pad; and the third ends of the second conductive bodies are electrically connected to the second signal pad or the third ground pad.

Further, when the first circuit substrate and the second circuit substrate are stacked, the second signal pad corresponds to the signal circuit, and the third ground pad corresponds to the first ground pads.

Further, both the first circuit substrate and the second circuit substrate are flexible circuit substrates.

A circuit board includes:

At least one first circuit substrate and at least one second circuit substrate overlapped with the first circuit substrate; each of the first circuit substrates includes a first base layer, a first circuit layer, and a plurality of first conductive bodies arranged in the first base layer; the first conductive bodies are formed by an electroplating process; wherein, the first circuit layer includes an etching line; the etching line divides the first circuit layer into a hot pressing area located inside the etching line and a non-hot pressing area located outside the etching line; the hot pressing area includes the plurality of first conductive bodies; the first conductive body includes a first end and a second end opposite the first end; the first end is electrically connected to the hot pressing area; each of the second circuit substrates includes a second base layer, a second circuit layer, and a plurality of second conductive bodies; the second conductive bodies include a conductive paste; wherein, the second conductive body includes a third end and a fourth end opposite the third end; the third end is electrically connected to the second circuit layer; and the second end is electrically connected to the fourth end.

Further, the first circuit substrate further includes a third circuit layer opposite the first circuit layer; the third circuit layer includes a signal circuit and a plurality of first ground pads electrically isolated from the signal circuit; a side of the first ground pads adjacent to the first circuit layer is electrically connected to the first circuit layer through the first conductive bodies; a side of the first ground pads away from the first circuit layer is electrically connected to the second circuit layer through the second conductive bodies; and the electrically connected first circuit layer, first conductive bodies, first ground pads, second conductive bodies, and second circuit layer form a shielding shell, and the signal circuit is located in the shielding shell.

Further, the first base layer is exposed inside the etching line; the etching line is in a semi-enclosed frame shape; the etching line divides the first circuit layer into the hot pressing area inside the frame and the non-hot pressing area outside the frame; the hot pressing area includes a copper sheet; the copper sheet is electrically connected to the non-hot pressing area; a second ground pad and a first signal pad are arranged in the copper sheet; the second ground pad and the first ground pads are electrically connected through the first conductive bodies; the second ground pad and the copper sheet are electrically connected through a plurality of microstructures; the first signal pad and the signal circuit are electrically connected through the first conductive bodies; and the first signal pad is electrically isolated from the copper sheet.

A method for manufacturing a circuit board assembly includes the steps of:

Providing a first circuit board, the first circuit board being the circuit board as described above;

Providing a second circuit board, the second circuit board including a connection area, and the connection area provided with a solder paste;

Stacking the first circuit board on the second circuit board so that the connection area is opposite the hot pressing area; and Heating the hot pressing area of the first circuit board, heat of the hot pressing area being transferred through the first conductive bodies and the second conductive bodies to a side of the first circuit board attached to the second circuit board to melt the solder paste, and cooling to obtain the circuit board assembly.

Compared with the related art, this disclosure includes at least the following advantages:

(1) A hot pressing area is formed on the circuit board, and the first conductive body formed by electroplating in the hot pressing area electrically connects adjacent layers. During the thermocompression soldering process, the heat transmission efficiency along the thickness of the circuit board is improved, thereby reducing the risk of forming brittle sintered interfaces.

(2) By setting the etching line on the first circuit layer to divide the hot pressing area and the non-hot pressing area, the first base layer is exposed from the etching line. During the thermocompression soldering process, the etching line can reduce the heat transfer from the hot pressing area to the non-hot pressing area to make the heat in the hot-pressing area more concentrated, which facilitates soldering at a lower temperature.

(3) The ground pad in the hot pressing area is connected to the copper sheet through microstructures, which is beneficial to reduce the heat transmission from the ground pad to the copper sheet, so that the heat of the ground pad is concentrated, and the soldering can be completed at a lower temperature.

SYMBOL DESCRIPTION OF MAIN COMPONENTS

Figure 1:
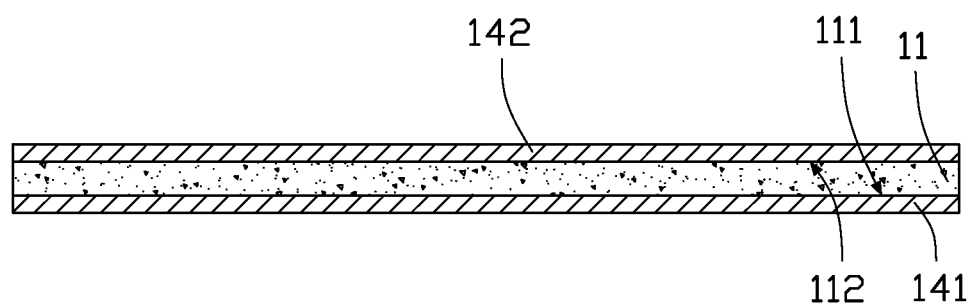
FIG. 1 is a schematic diagram of a double-sided copper-clad substrate provided by an embodiment of the disclosure.

Circuit board 100
First circuit substrate 10
First base layer 11
First surface 111
Second surface 112
First circuit layer 12
Copper sheet 1211
Second ground pad 1212
First signal pad 1213
Microstructures 1214
Hot pressing area 121
Non-hot pressing area 122
Etching line 123

First conductive body 13
First end 131
Second end 132
Double-sided copper-clad substrate 14
First copper foil layer 141
Second copper foil layer 142
First via hole 143
Electroplating layer 144
Third circuit layer 145
Signal circuit 1451
First ground pads 1452
Single-sided copper-clad substrate 15
Third copper foil layer 151
Second base layer 21
Second circuit substrate 20
Third surface 211
Fourth surface 212
Via hole 213
Second circuit layer 22
Second signal pad 221
Third ground pad 222
Second conductive body 23
Third end 231
Fourth end 232

The following specific embodiments will further illustrate this disclosure in conjunction with the above-mentioned drawings.

DETAILED DESCRIPTION

The technical solutions in the embodiments of the present disclosure will be described clearly and completely in conjunction with the accompanying drawings in the embodiments of the present disclosure. Obviously, the described embodiments are only a part of the embodiments of the present disclosure, rather than all the embodiments. Based on the embodiments in this disclosure, all other embodiments obtained by those of ordinary skill in the art without creative work shall fall within the protective scope of this disclosure.

Unless otherwise defined, all technical and scientific terms used in the description of this disclosure are the same as those usually understood by those skilled in the technical field. The terminology is only for the purpose of describing specific embodiments, and is not intended to limit the disclosure.

Figure 4:
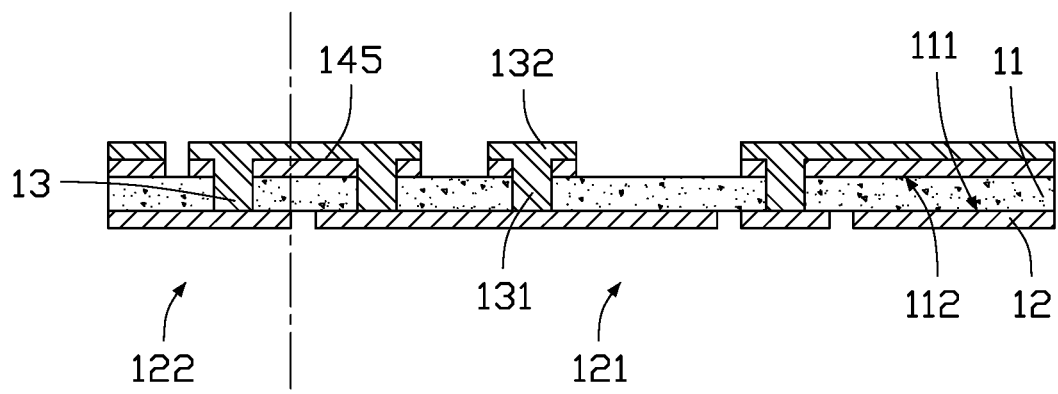
FIG. 4 is a schematic diagram of a first circuit substrate obtained in FIG. 3 by etching.

The embodiment of the present disclosure provides a method for manufacturing a circuit board 100, which includes the steps:

S1: referring to FIG. 4, providing at least one first circuit substrate 10. The first circuit substrate 10 includes a first base layer 11, a first circuit layer 12, and a plurality of first conductive bodies 13. The first conductive bodies 13 are formed by an electroplating process;

The first base layer 11 includes a first surface 111 and a second surface 112 opposite the first surface 111, and the first circuit layer 12 is arranged on the first surface 111;

The first circuit layer 12 includes an etching line 123, and the etching line 123 divides the first circuit layer 12 into a hot pressing area 121 located inside the etching line 123 and a non-hot pressing area 122 located outside the etching line 123. The hot pressing area 121 includes a plurality of the first conductive bodies 13;

The first conductive body 13 includes a first end 131 and a second end 132 opposite the first end 131. The first end 131 is electrically connected to the hot pressing area 121, and the second end 132 is exposed on the second surface 112.

Figure 10:
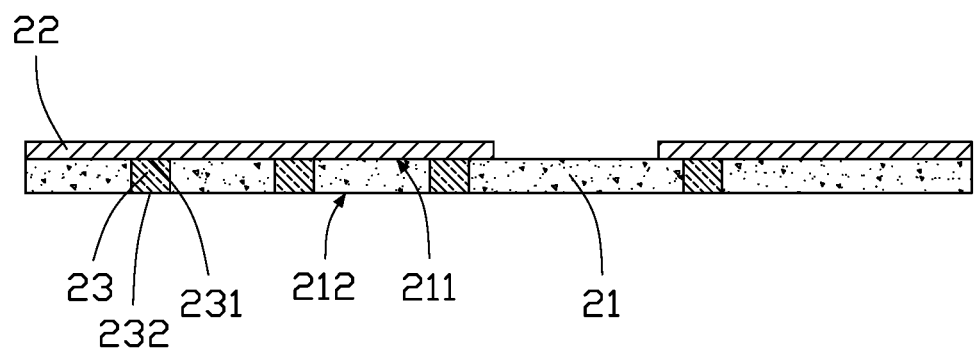
FIG. 10 is a schematic diagram of the second via holes shown in FIG. 9 filled with conductive paste to obtain a second circuit substrate.

S2: referring to FIG. 10, providing at least one second circuit substrate 20. The second circuit substrate 20 includes a second base layer 21, a second circuit layer 22, and a plurality of second conductive bodies 23. The second conductive body 23 includes conductive paste;

The second base layer 21 includes a third surface 211 and a fourth surface 212 opposite the third surface 211, and the second circuit layer 22 is arranged on the third surface 211;

The second conductive body 23 includes a third end 231 and a fourth end 232 opposite the third end 231. The third end 231 is electrically connected to the second circuit layer 22, and the fourth end 232 is exposed on the fourth surface 212.

S3: stacking each of the first circuit substrates 10 and each of the second circuit substrates 20 so that the second end 132 corresponds to the fourth end 232 to obtain an intermediate body (not shown in the figures).

Figure 12:
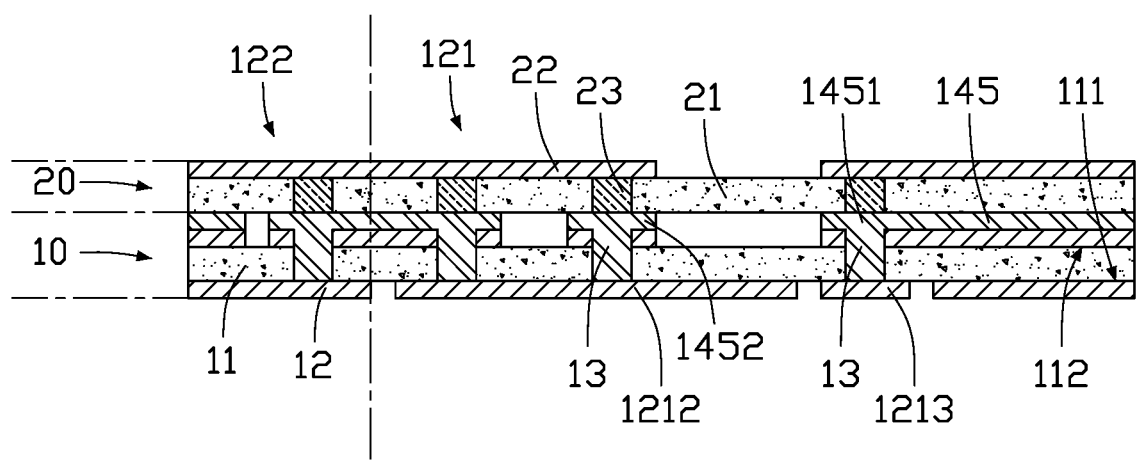
FIG. 12 is a schematic diagram of a circuit board provided by an embodiment of the disclosure.

S4: referring to FIG. 12, pressing the intermediate body to obtain the circuit board 100, wherein the second end 132 and the fourth end 232 are electrically connected.

In this embodiment, when the circuit board 100 and a main board (not shown) are soldered by hot pressing, it is first necessary to place a solder paste on a connection area (not shown) of the main board. The connection area corresponds to the hot pressing area 121 of the first circuit layer 12. Then the second circuit layer 22 of the circuit board 100 is attached to the solder paste in the connection area, a hot pressing head is pressed against the hot pressing area 121 of the first circuit layer 12, the hot pressing head heats the hot pressing area 121, and heat of the hot pressing area 121 is transferred through the first conductive bodies 13 and the second conductive bodies 23 to the second circuit layer 22, so that the solder paste directly in contact with the second circuit layer 22 is heated and melted. At the same time, the hot pressing head applies pressure to the circuit board 100, and the melted solder paste fully contacts the connection area between the second circuit layer 22 and the main board. After cooling, the circuit board 100 and the main board are soldered together.

In this embodiment, in step S1, providing the first circuit substrate 10 includes:

S10: referring to FIG. 1, providing a double-sided copper-clad substrate 14, which includes the first base layer 11, a first copper foil layer 141, and a second copper foil layer 142. The first base layer 11 includes the first surface 111 and the second surface 112 opposite the first surface 111. The first copper foil layer 141 is arranged on the first surface 111, and the second copper foil layer 142 is arranged on the second surface 112.

In this embodiment, the double-sided copper-clad substrate 14 is a flexible substrate.

Figure 2:
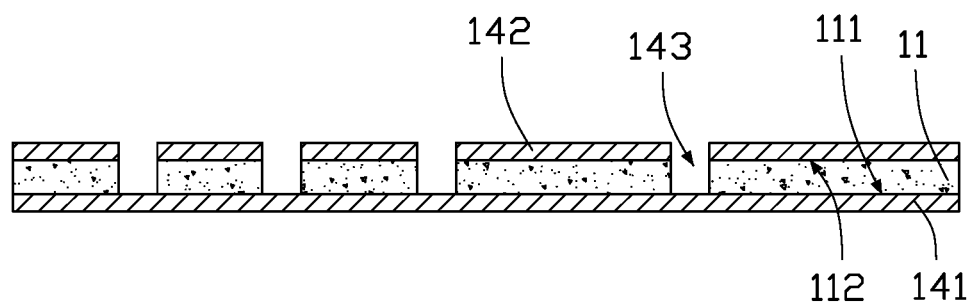
FIG. 2 is a schematic diagram after drilling first via holes on the double-sided copper-clad substrate shown in FIG. 1.

S11: referring to FIG. 2, drilling a plurality of first via holes 143 in the double-sided copper-clad substrate 14.

The first via holes 143 penetrate the second copper foil layer 142 and the first surface 111 and the second surface 112 of the first base layer 11. A side of the first copper foil layer 141 adjacent to the second copper foil layer 142 is exposed from the first via holes 143.

Figure 3:
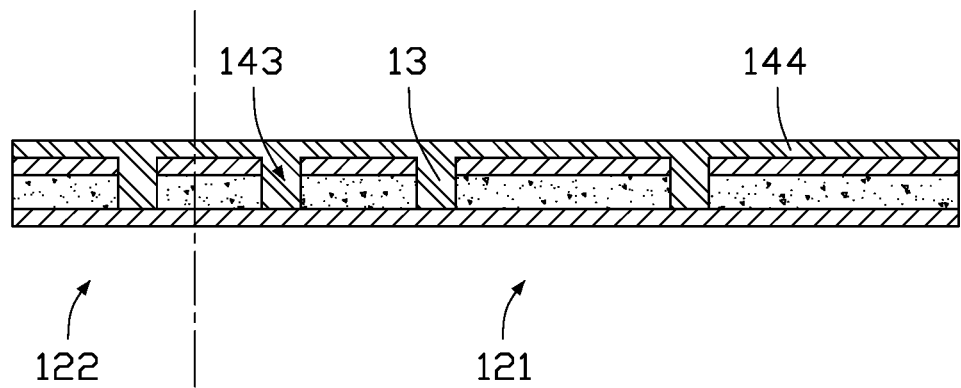
FIG. 3 is a schematic diagram of the first via holes shown in FIG. 2 after the first via holes are electroplated and filled.

S12: referring to FIG. 3, electroplating the second copper foil layer 142 to form an electroplated layer 144. A portion of the electroplated layer 144 is filled in the first via holes 143 to form the first conductive bodies 13.

In this embodiment, in step S12, the hot pressing area 121 and the non-hot pressing area 122 both form the first conductive bodies 13 in the first via holes 143 by an electroplating method. In other embodiments of the present disclosure, the hot pressing area 121 forms the first conductive bodies 13 in the first via holes 143 by an electroplating method, and the non-hot pressing area 122 forms the first conductive bodies 13 in the first via holes 143 by a conductive paste method (not shown).

S13: referring to FIG. 4, etching the first copper foil layer 141 to obtain the first circuit layer 12, and etching the second copper foil layer 142 and the electroplated layer 144 to obtain a third circuit layer 145.

Figure 5:
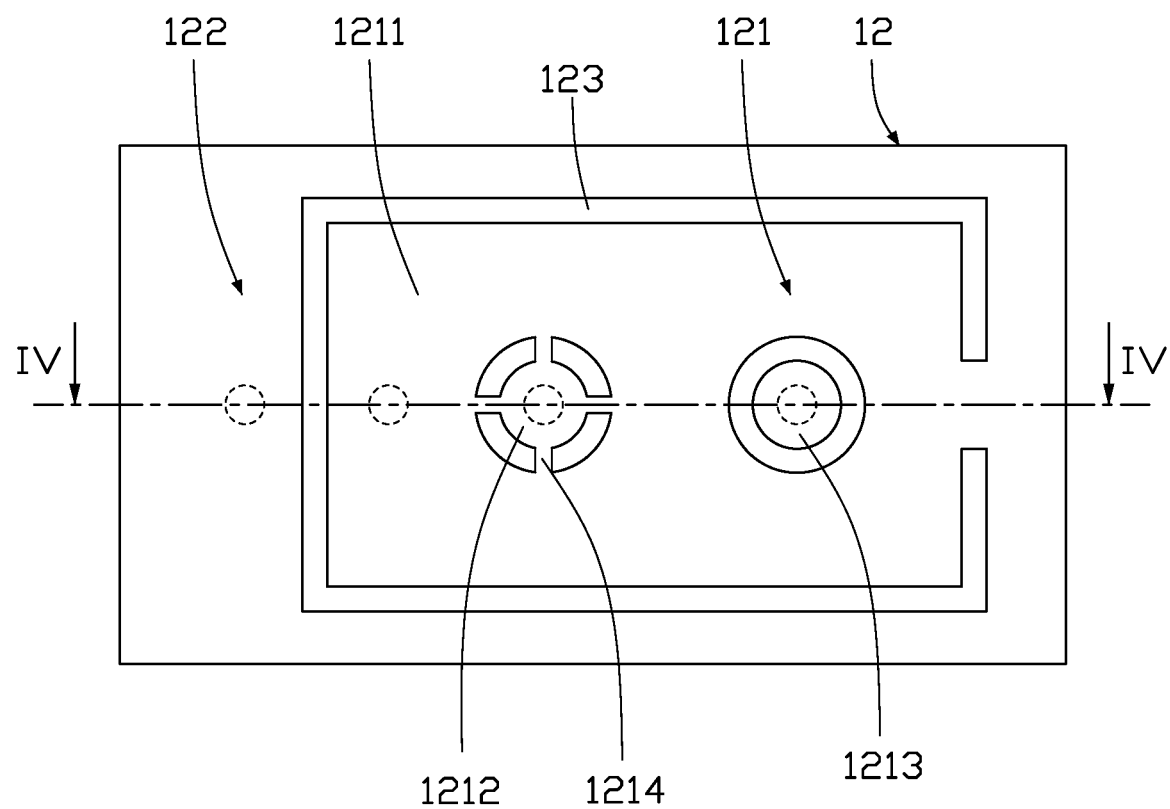
FIG. 5 is a bottom view of the circuit substrate shown in FIG. 4.

In this embodiment, referring to FIG. 5, in step S13, the first base layer 11 is exposed inside the etching line 123, and the etching line 123 is in the shape of a semi-enclosed frame. The first circuit layer 12 is divided into the hot pressing area 121 inside the frame and the non-hot pressing area 122 outside the frame. By providing the etching line 123 in the shape of a semi-enclosed frame, it is possible to effectively reduce heat conduction from the hot pressing area 121 (that is, inside the frame of the etching line 123) to the non-hot pressing area 122, so that the heat in the hot pressing area 121 is mainly conducted to the second circuit layer 22 through the first conductive bodies 13 and the second conductive bodies 23, so that hot-press soldering is completed under the condition of lower temperature, thereby reducing the risk of forming brittle sintered interfaces at the end of the second conductive bodies 23 due to high temperature, which is beneficial to improve the reliability of the product.

Figure 6:
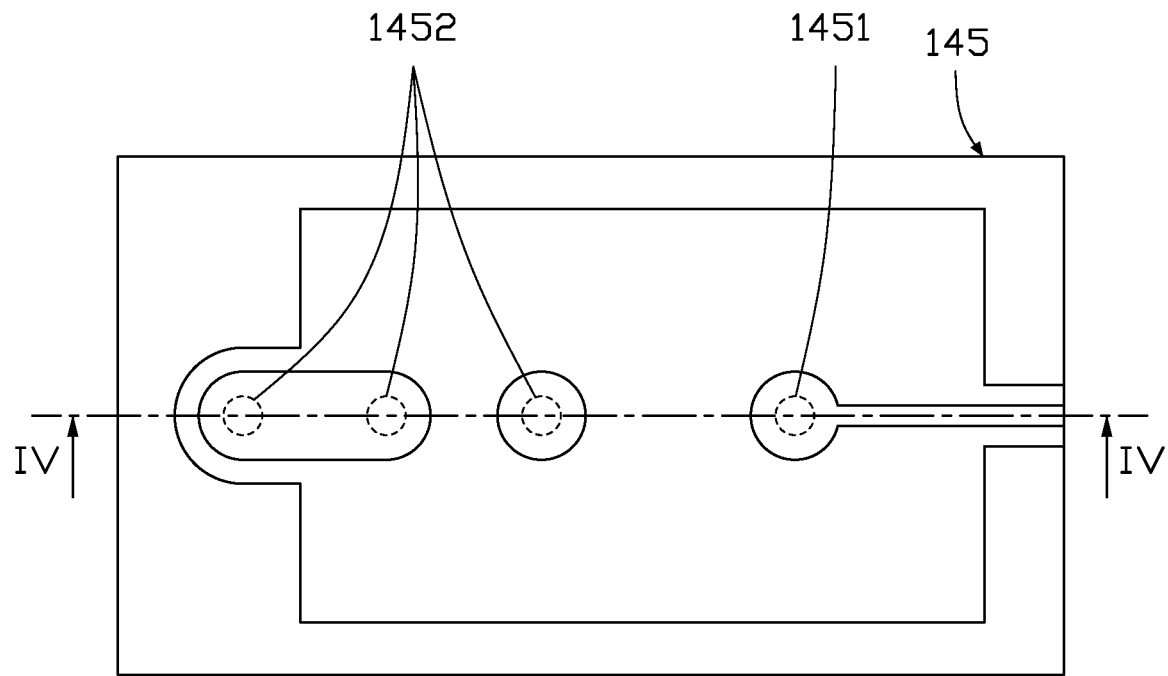
FIG. 6 is a top view of the circuit substrate shown in FIG. 4.

In this embodiment, referring to FIGS. 6 and 12, in step S13, the third circuit layer 145 includes a signal circuit 1451 and a plurality of first ground pads 1452 electrically isolated from the signal circuit 1451. A side of the first ground pads 1452 adjacent to the first circuit layer 12 is electrically connected to the first circuit layer 12 through the first conductive bodies 13, and a side of the first ground pads 1452 away from the first circuit layer 12 is electrically connected to the second circuit layer 22 through the second conductive bodies 23. The electrically conducted first circuit layer 12, first conductive bodies 13, first around pads 1452, second conductive bodies 23, and second circuit layer 22 form a shielding shell (not shown). The signal circuit 1451 is located in the shielding shell, and the shielding shell is used to shield high-frequency electrical signals in the signal circuit 1451.

In this embodiment, referring to FIG. 5, the hot pressing area 121 includes a copper sheet 1211, and the copper sheet 1211 is electrically connected to the non-hot pressing area 122. The copper sheet 1211 is provided with a second ground pad 1212 and a first signal pad 1213. The second ground pad 1212 and the first ground pads 1452 are electrically connected through the first conductive bodies 13. The second ground pad 1212 and the copper sheet 1211 are electrically connected through a plurality of microstructures 1214. The first signal pad 1213 and the signal circuit 1451 are electrically connected through the first conductive bodies 13. The first signal pad 1213 is electrically isolated from the copper sheet 1211. By connecting the second ground pad 1212 to the copper sheet 1211 and designing a separation between the copper sheet 1211 and the first signal pad 1213, the copper sheet 1211 can shield a portion of the electrical signals in the first signal pad 1213. By connecting the second ground pad 1212 and the copper sheet 1211 through the microstructures 1214, heat transfer from the second ground pad 1212 to the copper sheet 1211 during a thermocompression soldering process is reduced, so that the heat on the second ground pad 1212 is more concentratedly conducted to the second circuit layer 22, so that the second ground pad 1212 can complete the thermocompression soldering process under the condition of lower temperature, which can further reduce the risk of forming brittle sintered interfaces at the ends of the second conductive bodies 23 due to high temperature, and the reliability of the product is improved.

Further, referring to FIG. 6, the plurality of first ground pads 1452 includes two electrically conductive first ground pads 1452, and the two electrically conductive first ground pads 1452 are electrically connected to the copper sheet 1211 and the non-hot pressing area 122, respectively, through two first conductive bodies 13, so that the hot pressing area 121 and the non-hot pressing area 122 have electrical circuits, which is beneficial to improve the shielding effect of the copper sheet 1211 on the first signal pad 1213.

In this embodiment, referring to FIG. 12, the first ground pads 1452 correspond to the second ground pad 1212, and the first ground pads 1452 and the second ground pad 1212 are electrically connected through one of the first conductive bodies 13. The signal circuit 1451 corresponds to the first signal pad 1213, and the first signal pad 1213 is electrically connected to the signal circuit 1451 through one of the first conductive bodies 13. In other embodiments of the present disclosure, the first ground pads 1452 and the second ground pad 1212 may not correspond to each other, and the first ground pads 1452 and the second ground pad 1212 can be electrically connected through a plurality of the first conductive bodies 13. Similarly, a positional relationship between the signal circuit 1451 and the first signal pad 1213 and the number of the first conductive bodies 13 connecting the signal circuit 1451 and the first signal pad 1213 is not limited to one.

Figure 7:
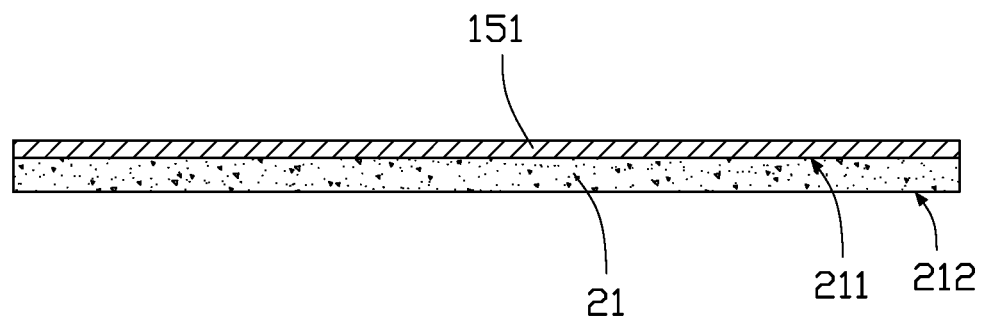
FIG. 7 is a schematic diagram of a single-sided copper-clad substrate provided by an embodiment of the disclosure.

In this embodiment, in step S2, providing the second circuit substrate 20 includes:

S20: referring to FIG. 7, providing a single-sided copper-clad substrate 15. The single-sided copper-clad substrate 15 includes the second base layer 21 and a third copper foil layer 151. The second base layer 21 includes the third surface 211 and the fourth surface 212 opposite the third surface 211, and the third copper foil layer 151 is arranged on the third surface 211;

In this embodiment, the single-sided copper-clad substrate 15 is a flexible substrate.

Figure 8:
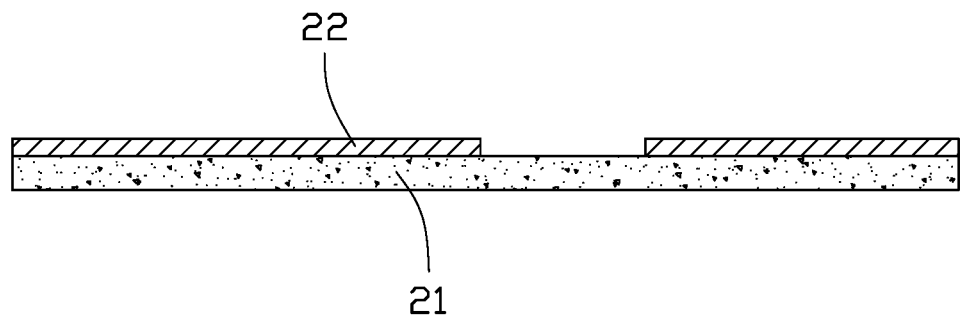
FIG. 8 is a schematic diagram after etching the single-sided copper-clad substrate shown in FIG. 7 to obtain a second circuit layer.
Figure 9:
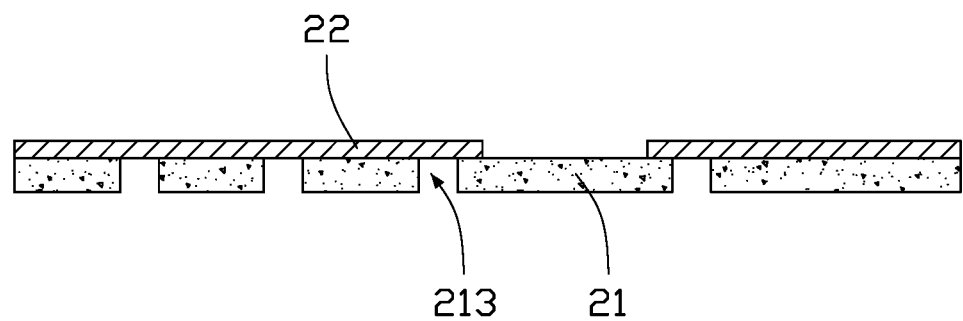
FIG. 9 is a schematic diagram of FIG. 8 after drilling second via holes.

S21: referring to FIG. 8, forming the second circuit layer 22 by etching the third copper foil layer 151. Referring to FIG. 9, a plurality of second via holes 213 is drilled on the second base layer 21. The second via holes 213 penetrate the third surface 211 and the fourth surface 212, so that a portion of a side of the second circuit layer 22 adjacent to the third surface 211 is exposed in the second via holes 213.

S22: referring to FIG. 10, filling a conductive paste into the second via holes 213. The conductive paste becomes the second conductive bodies 23 after being cured. The third ends 231 of the second conductive bodies 23 are electrically connected to the second circuit layer 22, and the fourth ends 232 of the second conductive bodies 23 are exposed from the second base layer 21.

Figure 11:
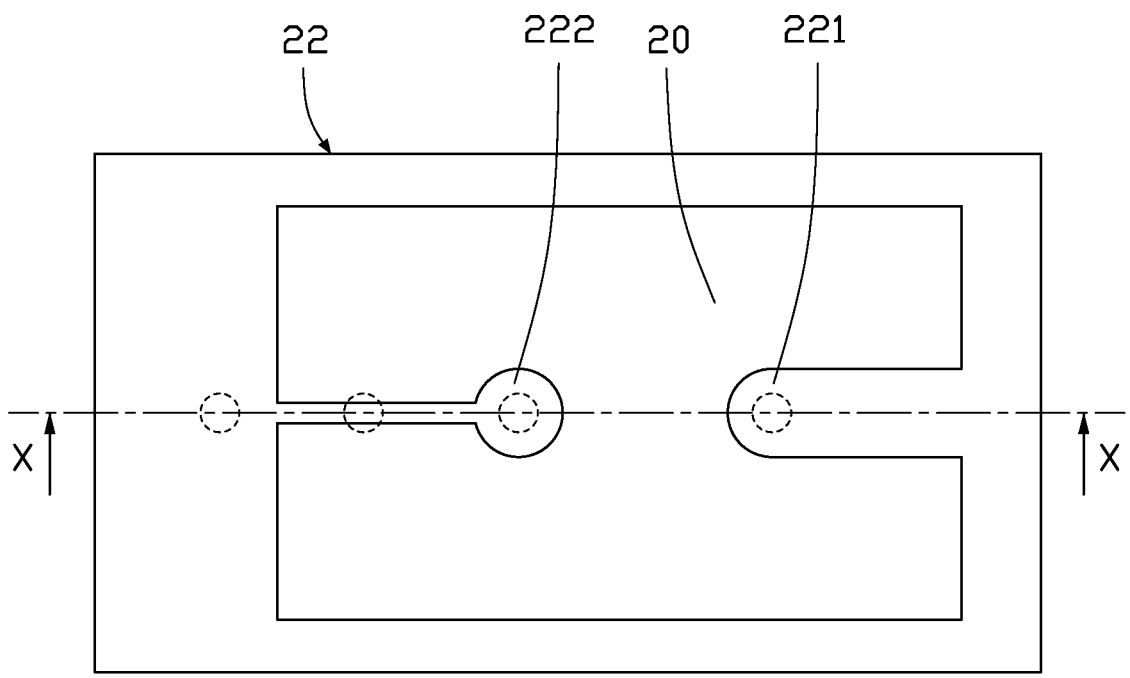
FIG. 11 is a top view of the second circuit substrate shown in FIG. 10.

In this embodiment, referring to FIG. 11, in step S21 and step S22, the second circuit layer 22 includes at least one second signal pad 221 and at least one third ground pad 222 that is electrically isolated from the second signal pad 221. The third ends 231 of the second conductive bodies 23 are electrically connected to the second signal pad 221 or the third ground pad 222.

In this embodiment, in step S3, before bonding the first circuit substrate 10 and the second circuit substrate 20, it includes:

S30: setting the third circuit layer 145 of the first circuit substrate 10 to face the second base layer 21 of the second circuit substrate 20;

S31: attaching the second circuit substrate 20 and the second base layer 21 so that the second signal pad 221 corresponds to the signal circuit 1451, and the third ground pad 222 corresponds to the first ground pads 1452;

In other embodiments of the present disclosure, in step S31, the second signal pad 221 and the signal circuit 1451 may correspond without overlapping holes but are electrically connected, and the third ground pad 222 and the first ground pads 1452 may correspond without overlapping holes but are electrically connected, so that positions of the second end 132 and the fourth end 232 can be staggered and electrically connected.

The present disclosure provides a circuit board 100, as shown in FIG. 12, which includes: at least one first circuit substrate 10 and at least one second circuit substrate 20 overlapped with the first circuit substrate 10.

Each of the first circuit substrates 10 includes: a first base layer 11, a first circuit layer 12, and a plurality of first conductive bodies 13 arranged in the first base layer 11. The first conductive bodies 13 are formed by an electroplating process; wherein, the first circuit layer 12 includes an etching line 123. The etching line 123 divides the first circuit layer 12 into a hot pressing area 121 located inside the etching line 123 and a non-hot pressing area 122 located outside the etching line 123. The hot pressing area 121 includes a plurality of the first conductive bodies 13. The first conductive body 13 includes a first end 131 and a second end 132 opposite the first end 131. The first end 131 is electrically connected to the hot pressing area 121;

Each of the second circuit substrates 20 includes a second base layer 21, a second circuit layer 22, and a plurality of second conductive bodies 23. The second conductive body 23 includes a conductive paste; wherein, the second conductive body 23 includes a third end 231 and a fourth end 232 opposite the third end 231, and the third end 231 is electrically connected to the second circuit layer 22;

The second end 132 and the fourth end 232 are electrically connected.

In this embodiment, referring to FIGS. 1 to 12, the first circuit substrate 10 further includes a third circuit layer 145 arranged on the second surface 112. The third circuit layer 145 includes a signal circuit 1451 and a plurality of first ground pads 1452 electrically isolated from the signal circuit 1451. A side of the first ground pads 1452 adjacent to the first circuit layer 12 is electrically connected to the first circuit layer 12 through the first conductive bodies 13, and a side of the first ground pads 1452 away from the first circuit layer 12 is electrically connected to the second circuit layer 22 through the second conductive bodies 23. The electrically connected first circuit layer 12, first conductive bodies 13, first ground pads 1452, second conductive bodies 23, and second circuit layer 22 form a shielding shell. The signal circuit 1451 is located inside the shielding shell. The shielding shell is used for shielding the high-frequency electrical signals in the signal circuit 1451.

In this embodiment, the first base layer 11 is exposed inside the etching line 123. The etching line 123 is in the shape of a semi-enclosed frame. The etching line 123 divides the first circuit layer 12 into the hot pressing area 121 inside the frame and the non-hot pressing area 122 outside the frame.

The hot pressing area 121 includes a copper sheet 1211, and the copper sheet 1211 and the non-hot pressing area 122 are electrically connected. A second ground pad 1212 and a first signal pad 1213 are arranged in the copper sheet 1211. The second ground pad 1212 is electrically connected to the first ground pads 1452 through the first conductive bodies 13. The second ground pad 1212 is electrically connected to the copper sheet 1211 through a plurality of microstructures 1214. The first signal pad 1213 and the signal circuit 1451 are electrically connected through the first conductive bodies 13. The first signal pad 1213 is electrically isolated from the copper sheet 1211.

This disclosure also provides a method for manufacturing a circuit board assembly (not shown in the figures), including the steps:

(1) Providing a first circuit board (not shown in figures), the first circuit board being the above-mentioned circuit board 100;

(2) Providing a second circuit board (not shown in figures), the second circuit board including a connection area (not shown in figures), the connection area provided with solder paste;

(3) Laying the first circuit board on the second circuit board so that the connection area is opposite the hot pressing area 121;

(4) Heating the hot pressing area 121 of the first circuit board. The heat of the hot pressing area 121 is transferred through the first conductive bodies 13 and the second conductive bodies 23 to the side of the first circuit board adhered to the second circuit board to melt the solder paste. The circuit board assembly is obtained after cooling.

In this embodiment, in step (2), the first circuit board may be a mobile phone high-frequency signal transmission line, and the second circuit board may be a mobile phone main board.

Compared with the related art, this disclosure includes at least the following advantages:

(1) A hot pressing area is formed on the circuit board, and the first conductive body formed by electroplating in the hot pressing area electrically connects adjacent layers. During the thermocompression soldering process, the heat transmission efficiency along the thickness of the circuit board is improved, thereby reducing the risk of forming brittle sintered interfaces.

(2) By setting the etching line on the first circuit layer to divide the hot pressing area and the non-hot pressing area, the first base layer is exposed from the etching line. During the thermocompression soldering process, the etching line can reduce the heat transfer from the hot pressing area to the non-hot pressing area to make the heat in the hot-pressing area more concentrated, which facilitates soldering at a lower temperature.

(3) The ground pad in the hot pressing area is connected to the copper sheet through microstructures, which is beneficial to reduce the heat transmission from the ground pad to the copper sheet, so that the heat of the ground pad is concentrated, and the soldering can be completed at a lower temperature.

In addition, for those of ordinary skill in the art, various other corresponding changes and modifications can be made according to the technical concept of the present disclosure, and all these changes and modifications should fall within the protection scope of the present disclosure.

What is claimed is:

1. A method for manufacturing a circuit board, comprising the steps:

providing a first circuit substrate, the first circuit substrate comprising a first base layer, a first circuit layer, a third circuit layer, and a plurality of first conductive bodies arranged in the first base layer, the first conductive bodies formed by an electroplating process; wherein: the first circuit layer and the third circuit layer are arranged opposite sides of the first base layer, the first circuit layer comprises an etching line, the etching line dividing the first circuit layer into a hot pressing area located inside the etching line and a non-hot pressing area located outside the etching line; the hot pressing area comprising the plurality of first conductive bodies, the first conductive body comprising a first end and a second end opposite the first end, the first end electrically connected to the hot pressing area, the third circuit layer includes a signal circuit and a plurality of first ground pads electrically isolated from the signal circuit; a side of the first ground pads adjacent to the first circuit layer is electrically connected to the first circuit layer through the plurality of first conductive bodies;

providing a second circuit substrate, the second circuit substrate comprising a second base layer, a second circuit layer, and a plurality of second conductive bodies, the second conductive bodies comprising a conductive paste; wherein: the second conductive body comprises a third end and a fourth end opposite the third end, the third end electrically connected to the second circuit layer;

stacking the first circuit substrate and the second circuit substrate such that the second end corresponds to the fourth end in position to obtain an intermediate body; and pressing and bonding the intermediate body so that the second end and the fourth end are electrically connected to obtain the circuit board, wherein a side of the first ground pads away from the first circuit layer is electrically connected to the second circuit layer through the second conductive bodies; the electrically connected first circuit layer, first conductive bodies, first ground pads, second conductive bodies, and second circuit layer form a shielding shell; and the signal circuit is located in the shielding shell.

2. The method for manufacturing a circuit board of claim 1, wherein providing the first circuit substrate comprises the steps of:

providing a double-sided copper-clad substrate, the double-sided copper-clad substrate comprising a first base layer, a first copper foil layer, and a second copper foil layer, the first copper foil layer and the second copper foil layer arranged on two opposite surfaces of the first base layer;

defining a plurality of first via holes in the double-sided copper-clad substrate, the first via holes penetrating the second copper foil layer and the first base layer;

electroplating the second copper foil layer to form an electroplated layer, a portion of the electroplated layer filled in the first via holes to form the first conductive bodies; and etching the first copper foil layer to obtain the first circuit layer, and etching the second copper foil layer and the electroplated layer to obtain the third circuit layer, thereby obtaining the first circuit substrate.

3. The method for manufacturing a circuit board of claim 2, wherein: the plurality of first ground pads comprises two electrically conductive first ground pads; and the two electrically conductive first ground pads are electrically connected to the hot pressing area and the non-hot pressing area, respectively, through two first conductive bodies, so that the hot pressing area and the non-hot pressing area are electrically connected to each other.

4. The method for manufacturing a circuit board of claim 3, wherein: the hot pressing area comprises a copper sheet, and the copper sheet is electrically connected to the non-hot pressing area; a second ground pad and a first signal pad are arranged in the copper sheet; the second ground pad and the first ground pads are electrically connected through the first conductive bodies; the second ground pad and the copper sheet are electrically connected through a plurality of microstructures; the first signal pad and the signal circuit are electrically connected through the first conductive bodies; and the first signal pad is electrically isolated from the copper sheet.

5. The method for manufacturing a circuit board of claim 3, wherein providing the second circuit substrate comprises the steps of:

providing a single-sided copper-clad substrate, the single-sided copper-clad substrate comprising a second base layer and a third copper foil layer formed on a surface of the second base layer;

etching the third copper foil layer to form the second circuit layer;

defining a plurality of second via holes in the second base layer, the second via holes penetrating the second base layer; and filling the second via holes with a conductive paste to obtain the second conductive bodies, thereby obtaining the second circuit substrate.

6. The method for manufacturing a circuit board of claim 5, wherein: the second circuit layer comprises at least one second signal pad and at least one third ground pad electrically isolated from the second signal pad; and the third ends of the second conductive bodies are electrically connected to the second signal pad or the third ground pad.

7. The method for manufacturing a circuit board of claim 6, wherein: when the first circuit substrate and the second circuit substrate are stacked, the second signal pad corresponds to the signal circuit, and the third ground pad corresponds to the first ground pads.

8. The method for manufacturing a circuit board of claim 1, wherein: the first circuit substrate and the second circuit substrate are both flexible circuit substrates.

9. A method for manufacturing a circuit board assembly, the method comprising:

providing a first circuit board, the first circuit board comprising:

at least one first circuit substrate and at least one second circuit substrate overlapped with the first circuit substrate, each of the first circuit substrates comprising a first base layer, a first circuit layer, and a plurality of first conductive bodies arranged in the first base layer, the first conductive bodies formed by an electroplating process; wherein: the first circuit layer comprises an etching line; the etching line divides the first circuit layer into a hot pressing area located inside the etching line and a non-hot pressing area located outside the etching line; the hot pressing area comprises the plurality of first conductive bodies; the first conductive body comprises a first end and a second end opposite the first end; the first end is electrically connected to the hot pressing area;

each of the second circuit substrates comprises a second base layer, a second circuit layer, and a plurality of second conductive bodies; the second conductive bodies comprise a conductive paste; wherein: the second conductive body comprises a third end and a fourth end opposite the third end; the third end is electrically connected to the second circuit layer; and the second end is electrically connected to the fourth end;

providing a second circuit board, the second circuit board comprising a connection area, and the connection area provided with a solder paste;

stacking the first circuit board on the second circuit board so that the connection area is opposite the hot pressing area; and heating the hot pressing area of the first circuit board, heat of the hot pressing area being transferred through the first conductive bodies and the second conductive bodies to a side of the first circuit board attached to the second circuit board to melt the solder paste, and cooling to obtain the circuit board assembly.

10. The method for manufacturing a circuit board assembly of claim 9, wherein: the first circuit substrate further comprises a third circuit layer opposite the first circuit layer; the third circuit layer comprises a signal circuit and a plurality of first ground pads electrically isolated from the signal circuit; a side of the first ground pads adjacent to the first circuit layer is electrically connected to the first circuit layer through the first conductive bodies; a side of the first ground pads away from the first circuit layer is electrically connected to the second circuit layer through the second conductive bodies; and the electrically connected first circuit layer, first conductive bodies, first ground pads, second conductive bodies, and second circuit layer form a shielding shell, and the signal circuit is located in the shielding shell.

11. The method for manufacturing a circuit board assembly of claim 10, wherein:

the first base layer is exposed inside the etching line; the etching line is in a semi-enclosed frame shape; and the etching line divides the first circuit layer into the hot pressing area inside the frame and the non-hot pressing area outside the frame;

the hot pressing area comprises a copper sheet; the copper sheet is electrically connected to the non-hot pressing area; a second ground pad and a first signal pad are arranged in the copper sheet; the second ground pad and the first ground pads are electrically connected through the first conductive bodies; the second ground pad and the copper sheet are electrically connected through a plurality of microstructures; the first signal pad and the signal circuit are electrically connected through the first conductive bodies; and the first signal pad is electrically isolated from the copper sheet.

* * * * *